(12) United States Patent
Brunnbauer et al.

(10) Patent No.: US 8,188,585 B2
(45) Date of Patent: May 29, 2012

(54) ELECTRONIC DEVICE AND METHOD FOR PRODUCING A DEVICE

(75) Inventors: Markus Brunnbauer, Lappersdorf (DE); Harry Hedler, Germering (DE); Thorsten Meyer, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 196 days.

(21) Appl. No.: 11/837,118

(22) Filed: Aug. 10, 2007

(65) Prior Publication Data

US 2008/0036065 A1 Feb. 14, 2008

(30) Foreign Application Priority Data

Aug. 10, 2006 (DE) .................. 10 2006 037 538

(51) Int. Cl.
*H01L 23/02* (2006.01)
(52) U.S. Cl. ......... 257/686; 438/109; 438/675; 438/123
(58) Field of Classification Search .......... 257/687, 257/690, 772, 780; 438/109, FOR. 368, 438/FOR. 426, 12, 13, 39–44, 115, 458, 459, 438/626, 631, 633, 689–757, 759, 940, 959, 438/963, 977, FOR. 100–FOR. 134, FOR. 370, 438/FOR. 385–FOR. 406, FOR. 485, 612–617, 438/15, 25, 26, 51, 55, 64–67, 112, 124, 438/126, 127
See application file for complete search history.

(56) References Cited

U.S. PATENT DOCUMENTS

| | | | | |
|---|---|---|---|---|
| 5,270,261 A | * | 12/1993 | Bertin et al. | 438/109 |
| 5,273,938 A | * | 12/1993 | Lin et al. | 438/107 |
| 5,620,927 A | * | 4/1997 | Lee | 29/841 |
| 6,522,022 B2 | * | 2/2003 | Murayama | 257/786 |
| 6,590,287 B2 | * | 7/2003 | Ohuchi | 257/738 |
| 6,714,418 B2 | * | 3/2004 | Frankowsky et al. | 361/735 |
| 6,798,057 B2 | | 9/2004 | Bolkin et al. | |
| 7,081,403 B1 | * | 7/2006 | Kirloskar et al. | 438/612 |
| 7,494,845 B2 | * | 2/2009 | Hwang et al. | 438/109 |
| 7,795,717 B2 | | 9/2010 | Goller | |
| 2002/0004288 A1 | * | 1/2002 | Nishiyama | 438/464 |
| 2003/0020062 A1 | * | 1/2003 | Faris | 257/40 |
| 2003/0062606 A1 | * | 4/2003 | Chun et al. | 257/666 |
| 2004/0219718 A1 | * | 11/2004 | Quah | 438/123 |
| 2004/0229401 A1 | * | 11/2004 | Bolken et al. | 438/109 |
| 2005/0023655 A1 | * | 2/2005 | Fee et al. | 257/676 |
| 2005/0121764 A1 | | 6/2005 | Mallik et al. | |
| 2005/0140021 A1 | * | 6/2005 | Wakisaka et al. | 257/777 |
| 2006/0079020 A1 | | 4/2006 | Omizo et al. | |
| 2007/0184654 A1 | * | 8/2007 | Akram et al. | 438/675 |
| 2007/0241445 A1 | | 10/2007 | Ikenaga et al. | |

FOREIGN PATENT DOCUMENTS

| | | |
|---|---|---|
| DE | 10164800 | 8/2003 |
| DE | 112005001681 T5 | 6/2007 |
| WO | 2004100253 A2 | 11/2004 |

* cited by examiner

*Primary Examiner* — Wai-Sing Louie
*Assistant Examiner* — Suian Tang
(74) *Attorney, Agent, or Firm* — Dicke, Billig & Czaja, PLLC

(57) ABSTRACT

An electronic device or devices and method for producing a device is disclosed. One embodiment provides an integrated component, a first package body and a contact device. The contact device penetrates the package body.

28 Claims, 5 Drawing Sheets

ELECTRONIC DEVICE AND METHOD FOR PRODUCING A DEVICE

CROSS-REFERENCE TO RELATED APPLICATIONS

This Utility Patent Application claims priority to German Patent Application No. DE 10 2006 037 538.6 filed on Aug. 10, 2006, which is incorporated herein by reference.

BACKGROUND

The invention relates to an electronic device, in particular with an integrated component or chip.

An integrated component includes, for example, an integrated circuit, for example with a number of circuit elements, for example transistors or sensors, or with just one circuit element. Such integrated components are used, for example, in electronic circuits of motor vehicles, cellphones, cameras, etc.

The devices are provided, for example, with a package body. In spite of the package body, the device is however intended to be as small as possible.

There is a need for a simply constructed device which can in particular be produced in a simple manner. The device is intended to have a small overall height and/or be simple to mount. In particular, there is a further need for a device stack. Furthermore, there is a need for a production method for a device. There is also a need for the use of a ball placing machine for this method, in particular a solder ball placing machine.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
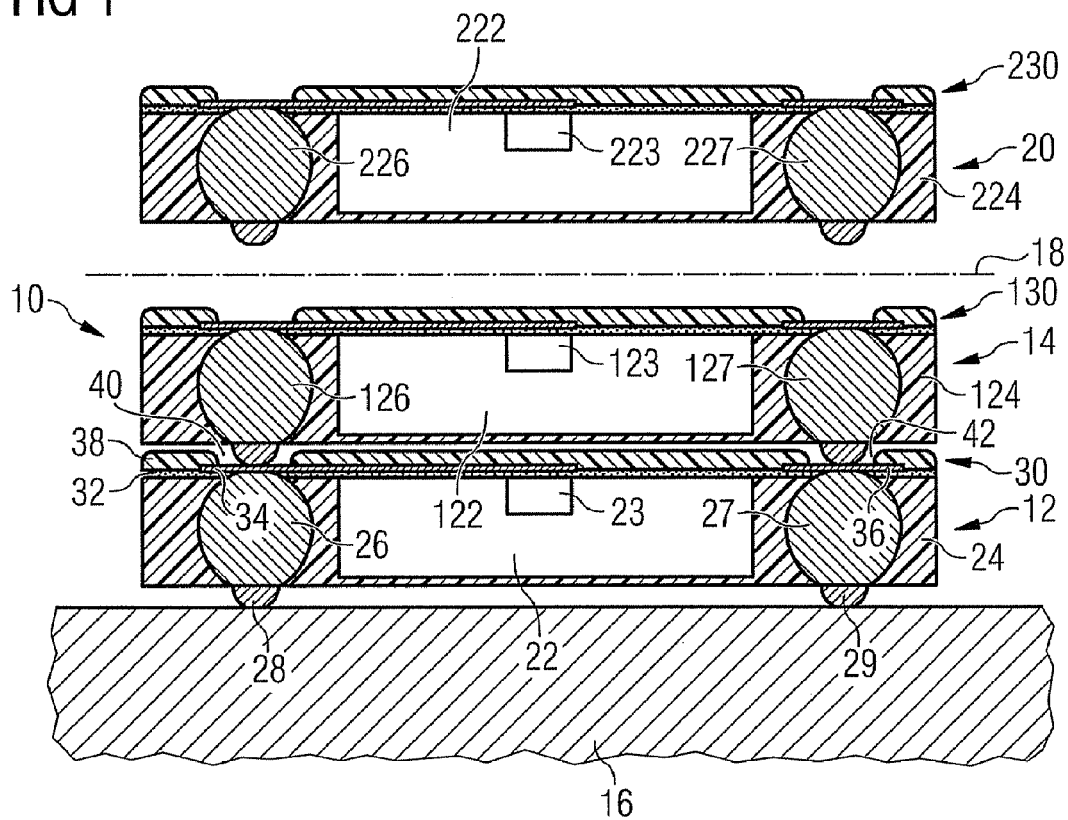
FIG. 1 illustrates a device stack including two or three packaged devices.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In one embodiment, a component is provided. The component includes an integrated circuit, a package body, and a first contact device, the contact device penetrating the package body.

In another embodiment, a method for producing a device is provided. The method includes arranging contact devices on the carrier, arranging an integrated component on the carrier, and introducing a material into the intermediate spaces between the contact devices and the circuit.

One embodiment provides a device with a compression-molded package body, which is arranged on a device stack or a printed circuit board. In one embodiment, the stacking of semiconductor devices or components is a suitable measure for increasing the packing density of semiconductor components by utilizing the third dimension. There is the stacking of semiconductor dice or chips (die stacking) and the stacking of devices or packaged components (package stacking).

When stacking semiconductor dice, previously exposed, i.e. unpackaged, semiconductor dice or chips are stacked in a single package body. This has the advantage that the stack has a small height and small lateral dimensions. Furthermore, the stack can be produced at low cost. However, the semiconductor die used must be one which has already been found to be defect-free, i.e. a "known good die" (KGD), in order to solve a problem with the yield in semiconductor die stacking. However, it is not possible, or only with considerable effort, to test an exposed semiconductor die in the same way as a semiconductor die already provided with a package.

When stacking devices or packaged components, semiconductor components are first provided with a package and then tested. After that, these devices are then stacked one on top of the other to form a device stack. For this purpose, a connection in the vertical direction is required in the device stack.

The integrated component may, for example, include a semiconductor substrate, in particular a silicon substrate or a compound semiconductor substrate. However, SOI (silicon on insulator) substrates may also be used. The integrated component may include a multiplicity of electronic semiconductor components, for example, bipolar transistors or CMOS (complementary metal oxide semiconductor) transistors.

The package body may, for example, consist of or contain an electrically insulating material or else, given appropriate electrical insulation with respect to the contact devices, an electrically conductive material. Polymers, such as resins or plastic materials, can be used, for example, as a package body. The package body holds the constituent parts of the device together and protects the chip from environmental influences, such as moisture or mechanical stress. The package body can be produced, for example, by compression molding, printing, spin-coating or pouring and possibly subsequent curing.

In the case of one embodiment, the contact devices may consist completely of a metal or a metal alloy or have a metallic surface. Suitable metals are, for example, copper, copper alloys with more than 80 atomic percent of copper or solder materials. Solder balls may be used, for example, as contact devices. For example, lead-free solders are used, but also other solders.

The penetration of the package body may be understood, or is understood, as meaning that the contact element penetrates right through the package body from one surface region to another surface region. The penetration of the package body may mean, or does mean, that the contact element is enclosed or encapsulated by the package body, except for two ends of the contact element.

For example, the contact devices are completely filled bodies, in particular of a homogeneous material. The contact devices have a hollow core or a core of a different material than a metallic shell of the contact devices. For example, the core is likewise electrically conductive or electrically insulating.

For example, conducting structures included in a wiring arrangement may connect the integrated circuit to the contact devices. The conducting structures may, for example, be conducting tracks or plated-through holes or vias.

In one embodiment of a device, the integrated circuit and the filling material as well as the contact devices may lie in a first plane. The chip, the filling material and the contact devices are on the same side of the wiring arrangement. This measure already allows the overall height of a packaged component to be reduced considerably. In one embodiment, in the case of a compact construction, the wiring arrangement extends along its width in a second plane, which lies parallel or substantially parallel to the first plane.

The contact devices may advantageously be balls. The ball form is used because spherical contact devices can be produced in a simple manner, for example by solidifying metal drops. The molten metal thereby assumes the ball form of its own accord, to minimize the surface tension. The use of balls also offers the advantage that, when soldering the contact devices, the contact devices can be securely held in the package body. Should the contact devices become soft, for example during soldering, they will not change their shape again on account of the surface tension, so that no intermediate spaces occur between the contact devices and the package body.

The balls may in each case have a deformed side. For example, in each case a piece of the balls has first been removed in a planarizing process and then solder material has been re-applied to these locations. In another embodiment, deformed locations may also be present on two sides of the balls that are facing away from each other.

In one embodiment, the contact devices may consist completely or to 100 percent of solder material, i.e. of a material with a melting temperature lower than 400° C. (degrees Celsius). The contact devices may contain solder material, for example to at least 75 atomic percent. Smaller proportions than 75 atomic percent of solder material are sufficient, for example if a coating of a solid core with solder material is chosen. The use of solder material ensures good solderability in the mounting of the package device. Furthermore, solder balls offer the advantage that they retain their ball form when heated, because this is a low-energy state. For example, cylindrical contact devices of solder material have a greater tendency when heated for a solder ball to form at an end of a cylindrical bore or opening. In this embodiment, however, solder would be sucked out from the bore or opening, so that solder-free locations may also occur, and these would lead to incorrect contacting.

The contact devices may have in each case a curved line of intersection with a plane that extends in the direction normal to the first plane. This requirement is also met, for example, by contact devices of an ellipsoid form, barrel form etc. The aforementioned technical effects consequently continue to apply, albeit to a reduced extent.

In one embodiment, the contact devices may be adjacent the filling material or the package body, or the first component or the circuit and the contact devices are enclosed by the package body. This is the consequence of a production method explained below for producing a packaged component which includes the package body, the integrated component and the contact devices. In one embodiment, the package body is homogeneous, in particular with regard to its composition.

The package body may consist of a resin, or it contains a resin. In one embodiment, epoxy resins are particularly well suited for compression-molding processes, with which devices for high requirements can be produced in a simple and low-cost manner.

The wiring arrangement may have a layer thickness of less than 15 micrometers or even of less than 10 micrometers. Consequently, the wiring arrangement is not a printed circuit board which contains, for example, FR4 (flame retardant type 4) or FR5 or BT material (bismaleimide triazine). This is because such printed circuit boards have thicknesses of greater than 150 micrometers, even if they only include one or two layers. The wiring arrangement with the small thickness of less than 50 micrometers is, in particular, a wiring arrangement produced by the thin-film technique, which is preferably produced directly on the circuit or on the package body. Consequently, there are no bonding processes or flip-chip processes at this point, and very high-quality connections can be produced between the circuit and the contact devices. Furthermore, the thin-film technique is particularly suitable for producing the packaged components at wafer level, i.e. a number of devices are processed in a slice that has the outer dimensions of a semiconductor wafer.

Also used, however, are wiring arrangements not produced by the thin-film technique on the package body, in particular wiring devices of the materials mentioned, such as FR4, FR5, BT or else of ceramic, etc. The wiring arrangement may, for example, also be formed from bonding wires or in some other manner.

In one embodiment, at least one lateral dimension, i.e. the width and/or the length, of the packaged component may be less than 30 mm (millimeters) or less than 20 mm. Typical packages even have dimensions of less than 7 mm. The height of the packaged component is also very small, for example less than 1 mm. For example, the package is only less than 10 percent higher than the contact devices. The package body has the same height as the integrated component. On one embodiment, devices of small dimensions are inserted in small, portable devices, such as for example cellphones, with a largest dimension of less than 10 cm (centimeters).

The package device also includes a second packaged component or even more than two packaged components. The second packaged component has preferably been produced by the same method as the first packaged component or as the first device. The two packaged components preferably lie parallel to each other, deviations occurring within the limits of mounting tolerances, which however are smaller than, for example, 3° (angular degrees). In one embodiment, the device stack is also particularly flat, in particular in comparison with a device stack with devices in which contact devices and chips are respectively arranged on sides of the wiring arrangement that are facing away from each other.

The contact devices of the one package may preferably be soldered, for example, onto conducting structures of the wiring arrangement of the other package. Consequently, the two components can be connected in a simple manner to form a component stack, in particular by flip-chip processes.

Furthermore, an embodiment of a method for producing a component is provided, performing the processes of:
providing a carrier,
arranging a multiplicity of contact devices on the carrier,
after arranging the contact devices or before arranging the contact devices, arranging an integrated circuit on the carrier, and
after arranging the circuit and the contact devices, introducing a material into the intermediate spaces between the contact devices or between the contact devices and the circuit. The material is preferably electrically insulating.

The method serves in particular for producing an aforementioned circuit arrangement, so that the technical effects mentioned there also apply to the method.

The contact devices may be arranged on the carrier in the solid state. Solid means here that the contact devices are not applied as a paste, i.e. in a pasty state.

Solder balls may preferably be arranged as contact devices. Used, for example, in this case is a commercially available machine that is also used for the placing of solder balls on intermediate printed circuit boards, for example in the production of what is known as a BGA (ball grid array). The solder balls are sucked by the machine, for example with the aid of a negative pressure or a vacuum, onto a holding device, which contains bores at the locations at which solder balls are to be arranged. The holding device is then set down on the carrier, where the solder balls are released from the holding device, for example by switching off the negative pressure. This procedure is likewise suitable for processes that are carried out at wafer level, i.e. here a wafer formed by the filling material or package bodies. In this case, for example, over 1000 solder balls are placed simultaneously.

In one embodiment, a filling material for the package body may be introduced by a compression-molding process. These compression-molding processes are likewise suitable for the production of wafers from the filling material or package bodies. Consequently, after the compression-molding, the filling material has dimensions like a semiconductor wafer, for example a diameter of 20 cm (centimeters), 30 cm or more than 30 cm. Consequently, machines that are otherwise used or could be used for the processing of semiconductor wafers are used or can be used in particular for producing the wiring arrangement.

The filling material or the package body is or may preferably be worked back, so that the contact devices are exposed on the worked-back side of the filling material or package body. For example, an etching-back process or a chemical-mechanical polishing process is used. Just mechanical polishing processes may also be suitable. The working-back process produces a planar surface, which facilitates later mounting. Furthermore, the planar surface is particularly suitable for carrying out further method processes, for example, as part of a thin-film technique or screen printing to apply a solder paste to the contact devices.

In one embodiment, a wiring arrangement may be produced by the thin-film technique on the circuit or on the contact devices and on the package body. Consequently, layer depositing processes and lithography processes such as are used in the case of integrated circuits are used, although in the case of the thin-film technique the minimum dimensions are typically greater than or equal to the minimum dimensions in the upper metallization layer of an integrated circuit. A very flat packaged component is obtained, in particular requiring no printed circuit board. The thin-film technique is also suitable for processing at wafer level, i.e. here a number of packaged components can be produced from or in a filling-material wafer.

The contact devices may also be provided with a solder material, for example, with solder paste, on the side that is facing away from the wiring arrangement. The solder paste is applied, for example, by using screen printing. The thermal loading is particularly low when solder paste is used in this method.

In particular, the packaged component or the device may be soldered onto a further device after singulating or before singulating, the further device likewise including an integrated component. This produces a device stack of a small overall height.

The stated method processes may be carried out simultaneously in joint operations for a number of devices, in particular at wafer level. Consequently, the devices can be produced in a very low-cost way.

Furthermore, protection is afforded to the use of a ball placing machine for carrying out one of the stated processes, in particular a machine which places more than 1000 balls simultaneously.

To sum up, the proposed solutions mean that an intermediate carrier board (interposer) and wire bond connections can, but do not have to be, substituted by thin-film rerouting. Furthermore, the conductive filling for the instances of contacting in the z direction can be carried out at the same time as the production of the packaged component. In particular, known, commercially available and inexpensive materials are used, for example preformed solder balls or compression-molding compounds that are available on the market.

The production is also possible at wafer level, which ensures a high degree of parallelism, and consequently low costs. The lateral dimensions of the packaged component can likewise be kept adequately small on account of high-precision placement processes. A very small package height is also obtained on account of the embedding of the contact devices in the filling material. In addition, matching of the coefficient of thermal expansion (CTE) allows, for example, solder balls of a small diameter to be used in the case of comparatively large dimensions of the packaged component, of, for example, greater than 7 millimeters in width, and the thermo-mechanical reliability is nevertheless great. In particular, the diameter lies below 500 micrometers, below 400 micrometers or even below 200 micrometers. However, the diameter is greater than, for example, 100 micrometers.

In one embodiment, a universal package wafer compression-molding concept is provided, with solder balls also being embedded in a molding compound in addition to chips. This allows low-cost, flexible and very simple contacting in the z direction to be achieved. In one embodiment, a package-on-package stack can be constructed in a simple manner. The matching of the coefficients of thermal expansion of the materials used, for example the coefficient of thermal expansion of the molding compound is equal to the coefficient of thermal expansion of a printed circuit board onto which the packaged component is soldered, allows solder balls of a comparatively small diameter to be used, so that a particularly flat PoP (package on package) can be produced.

Whenever "can" or "may" is mentioned in this application, both the possibility and the actual realization of the stated measure in an embodiment are meant. Several embodiments of the invention are presented below on the basis of figures, which serve merely for purposes of illustration and are not intended to restrict the scope of the invention.

FIG. 1 illustrates a device stack 10, which includes two devices 12 and 14. The device 14 has been soldered onto the device 12, as explained in more detail below. As an alternative to solder, a conductive adhesive may be used for example. The device 12 has also been soldered or mounted in some other way on a printed circuit board 16, which also carries further electronic components, for example resistors, capacitors or coils, or further integrated circuits.

In the case of an alternative exemplary embodiment, the device stack 10 also includes a third device 20, see line 18. The third device 20 has then been soldered or mounted in some other way on the device 14.

The device 12 includes an integrated component 22 or an integrated circuit 22, for example based on a silicon substrate, in particular on an already ground-thin silicon substrate. The integrated component 22 includes a multiplicity of active semiconductor components, see, for example, transistor 23. In the exemplary embodiment, the active side of the component 22 is arranged toward a wiring arrangement 30. However, this is not necessarily so. The integrated component 22 also includes at least one or more metallization layers, which however are not represented and lie between the active components and a wiring arrangement 30 explained in more detail further below.

Furthermore, the device 12 also includes solder balls 26 and 27, which lie in the cross section of the device 12 that is represented in FIG. 1, and further solder balls that are not represented. All the solder balls 26 and 27 are arranged in a package body 24 or enclosed by a filling material of the package body 24. The production of the device 12 is explained in more detail below on the basis of FIGS. 2A to 2J.

The device 12 has been soldered onto the printed circuit board 16 by soldered connections 28, 29. The soldered connections 28 and 29 have been produced, for example, from a solder paste. Arranged on the side of the device 12 that is facing away from the printed circuit board 16 is a wiring arrangement 30, which in the example is produced by the thin-film technique. The wiring arrangement 30 includes, for example, an electrically insulating layer 32, for example a silicon dioxide layer, and a multiplicity of conducting tracks, of which two conducting tracks 34 and 36 are represented in FIG. 1. The wiring arrangement 30 also includes an optional solder resist layer 38 with openings 40, 42 for soldered connections toward the device 14.

In the exemplary embodiment, the device 14 is constructed in a way similar to the device 12, in particular solder balls 126 and 127 and an integrated component 122 are arranged in a package body 124. However, the component 122 has, for example, different functions than the component 22. The functions of the components 22 and 122 are the same, for example a memory function. A transistor 123 of the component 122 is represented in FIG. 1, in particular in order to identify the active side of the component 122. A wiring arrangement 130 includes conducting structures, which are arranged differently than the conducting structures in the wiring arrangement 30. However, wiring arrangements 30, 130 with the conducting structures following the same path are also used in a device stack.

In the case of the exemplary embodiment, the device 20 also has a construction similar to that of the devices 12 and 14. In one embodiment, there is an integrated component 222, a package body 224, solder balls 226, 227 and a wiring arrangement 230.

Figure 2A:
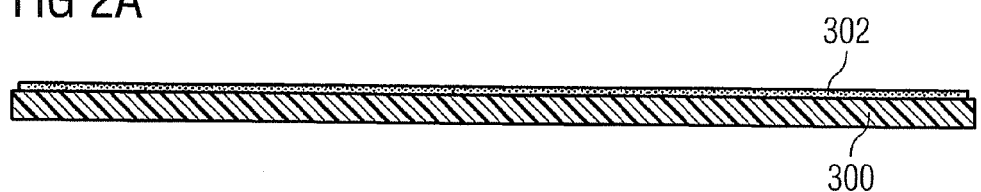
FIGS. 2A to 2J illustrate production stages in the production of the device stack.
Figure 2B:
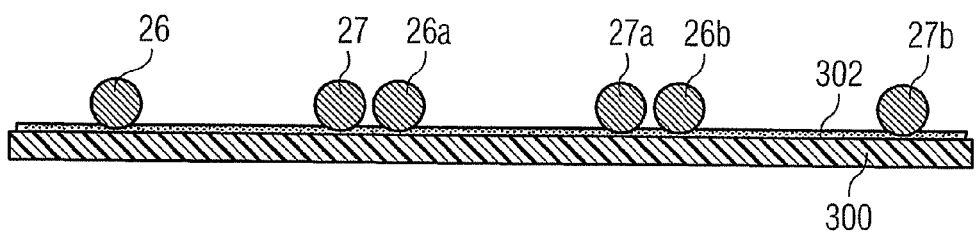
Figure 2C:
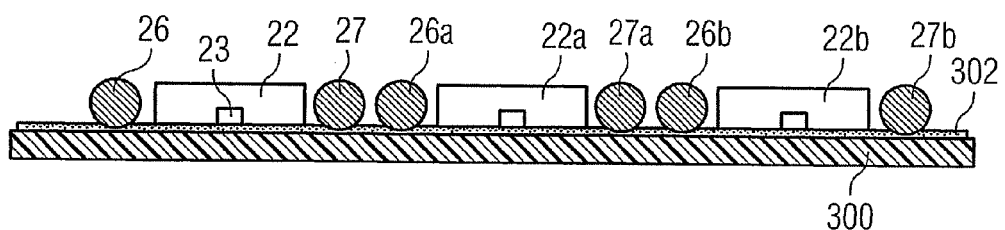
Figure 2D:
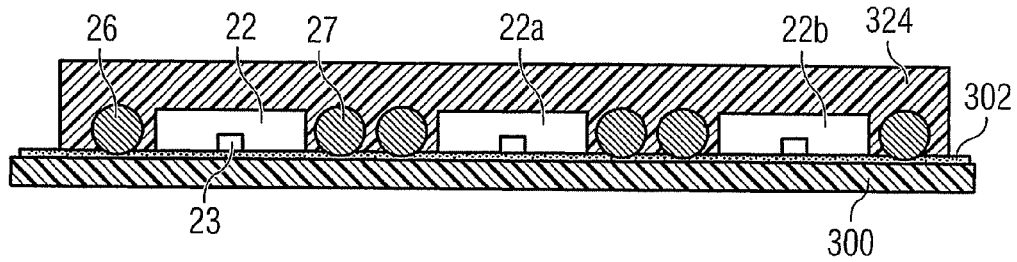
Figure 2E:
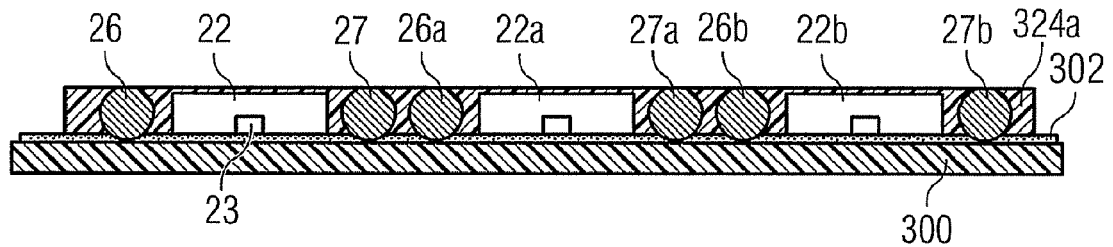
Figure 2F:
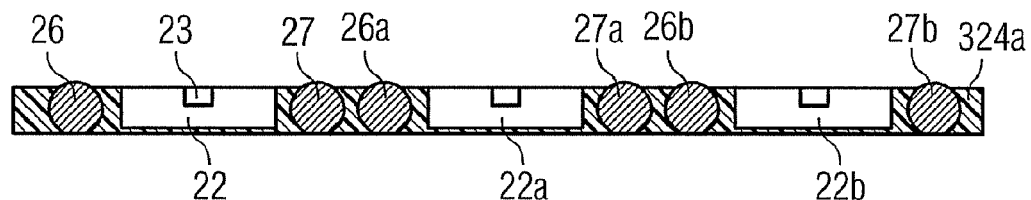
Figure 2G:
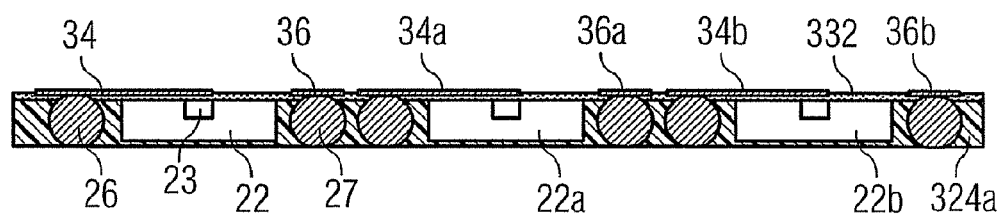
Figure 2H:
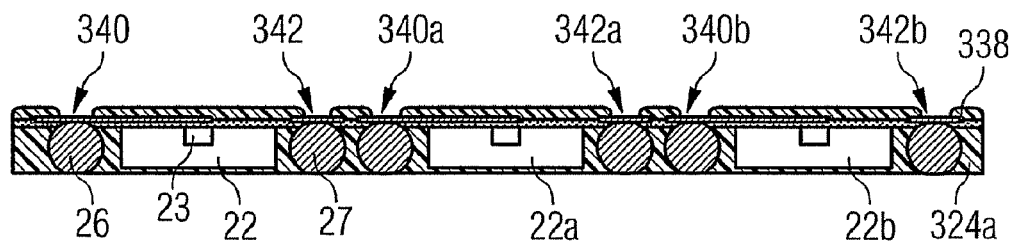
Figure 2I:
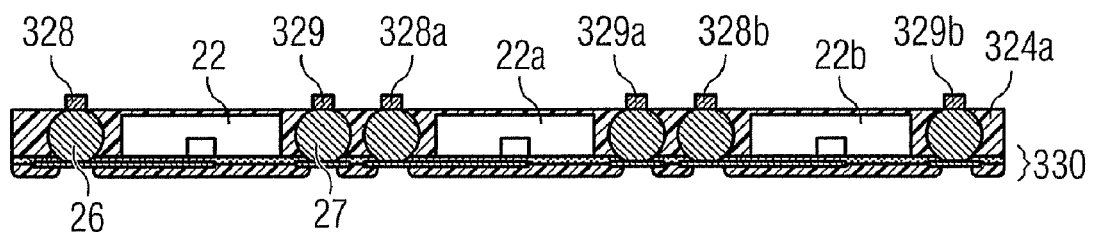
Figure 2J:
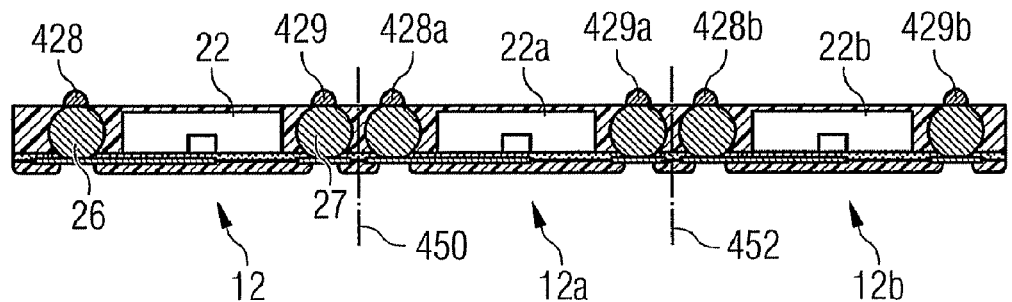

FIGS. 2A to 2J illustrate production stages in the production of the device 12 together with further devices 12a to 12b, see FIG. 2J. In one embodiment, the method processes are carried out at what is known as wafer level. However, the method processes may also be carried out separately for individual packages.

As represented in FIG. 2A, first a carrier sheet 300 is provided. The carrier sheet 300 consists, for example, of a metal, of silicone, of a polymer or of a ceramic or of some other material. An adhesive material, for example a double-sided adhesive film 302, is applied to the carrier sheet 300.

As represented in FIG. 2B, solder balls 26, 27, 26a, 27a, 26b, 27b and further solder balls that are not represented are subsequently placed on the exposed side of the film 302. This placement is carried out with the aid of a machine which automatically places the solder balls in one operation, for example, a Shibuya SBM. Alternatively, the solder balls for a single device are simultaneously placed, after which the solder balls for a neighboring component are then placed on the carrier sheet 300, and so on.

As represented in FIG. 2C, a multiplicity of integrated circuits or semiconductor dice 22, 22a, 22b, etc. are placed on the film 302, for example, with the aid of what is known as picking and placing. In this case, frontend-tested circuits are used in particular.

In the case of another configuration, the sequence of the method processes is changed over, so that the circuits 22, 22a, 22b are placed first and then the solder balls 26, 27, etc.

As represented in FIG. 2D, a compression-molding process is subsequently carried out, involving pressing a punch against the carrier sheet 300 and forcing a compression-molding compound for a package body 324 into the intermediate spaces between the solder balls 26, 27 and the circuit 22. Subsequently, for example, the pressing device is heated in the region of the filling material 324 until the latter has cured. The filling material may also be cured without additional heating. Epoxy resin filled with a filler to ensure a predetermined coefficient of thermal expansion is used, for example, as the compression-molding compound. The value of the coefficient of thermal expansion is matched, for example, to the value of the coefficient of thermal expansion of the printed circuit board 16, in particular is equal to the value of this coefficient of expansion.

Figure 4:
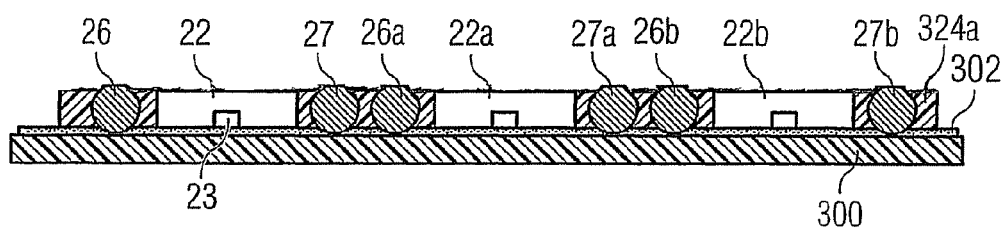
FIG. 4 illustrates an alternative production stage in the production of the device stack.

As illustrated in FIG. 2E, after the curing of the package body 324, a working-back process is performed, for example, by grinding material away, until the solder balls 26, 27, etc. are exposed on one side. At the point in time at which the removal is stopped, the package body 324 in the exemplary embodiment still easily covers the circuits 22, 22a, etc. In the case of other exemplary embodiments, however, as illustrated in FIG. 4, the semiconductor substrates of the components 22, 22a, etc., for example, are also exposed, possibly even further thinned.

FIG. 2F illustrates the thinned package bodies 324a, although the filling-material wafer has been turned over in comparison with FIG. 2E, so that now the active side of the components 22, etc. is facing up. Furthermore, the carrier 300 and the film 302 have been removed, for example, by using a chemical solvent or by using ultraviolet radiation. The filling-material wafer represented in FIG. 2F has the dimensions of a semiconductor wafer, but, for example, a smaller height than a semiconductor wafer. However, the height of the filling-material wafer may also be equal to the height of a semiconductor wafer or greater.

As represented in FIG. 2G, after the production of wiring arrangements, for example the wiring arrangement 30, an insulating layer 332 is applied. After that, the conducting structures 34, 36, 34a, 36a, 34b, 36b are produced, for example, from copper, in particular with the aid of a galvanic process. In the case of another exemplary embodiment, the conducting structures are applied directly, i.e. without an insulating layer 332 lying in between, to the components 22 and to the package body 324a.

As represented in FIG. 2H, after the production of single-layer or multi-layer wiring structure arrangements 30, etc., an optional solder resist layer 338 is also applied. Openings 340, 342, 340a, 342a, 340b, 342b, etc., at which soldered connections to a further packaged component or to an unpackaged integrated component or circuit can be established, are made in the solder resist layer 338.

As represented in FIG. 2I, the filling-material wafer represented in FIG. 2H is turned over once again, so that the active side of the components 22, etc. is facing down again.

For example, solder paste projections 328, 329, etc. are applied with the aid of a screen-printing process at the locations at which the contact devices 26, 27, etc. are exposed.

As represented in FIG. 2J, the solder paste projections 328, 329 are liquefied in a thermal step, at, for example, 260° C., so as to form hemispherical solder regions 428, 429, 428a, 429a, 428b, 429b, etc., which lie directly against the solder balls 26, 27, etc. The solder regions 428, 429, 428a, 429a, 428b, 429b preferably have a smaller diameter or a smaller volume than the solder balls 26, 27; in particular, the volume is less than 20 percent.

Subsequently, the devices 12, 12a, 12b, etc. are separated from one another at separating lines 450, 452. This is followed by mounting, the component 12, for example, being introduced into the device stack 10. Subsequently, the device stack 10 is soldered on the printed circuit board 16. In this soldering operation, the soldered connections 28, 29, etc. are produced from the solder regions 428, 429, etc., see FIG. 1. It is also possible for the devices only to be separated from one another and attached on the printed circuit board after the stack.

In other exemplary embodiments, at first only one device of the device stack is mounted on the printed circuit board 16. Only after that is a further device, or are further devices, soldered or mounted on the first-mounted device.

In other exemplary embodiments, underfillings are used, for example, between the device 12 and the printed circuit board 16 or else between the devices 12 and 14.

In one or more embodiments, there are a number of layers of conducting tracks in the wiring arrangements 30, 130, etc. It is also not imperative that in each case a solder ball 26 and a solder ball 126 are arranged one above the other. Devices with solder balls that are offset in relation to one another can also be connected to one another by using the wiring arrangements lying in between.

In another exemplary embodiment, the component 12 is individually soldered onto the printed circuit board 16, without further components 14, etc. being soldered on or mounted later. In this case, the wiring arrangement 30 preferably does not include a solder resist layer and/or any openings in the solder resist layer.

In another exemplary embodiment, different dimensions are used, in particular the devices 12, 14, etc. may have dimensions that are different from one another. Furthermore, in the case of other exemplary embodiments, a different arrangement of contact devices is chosen, for example, more than one row is arranged around the circuit, for example two rows, three rows or more than three rows, but preferably, for example, fewer than twenty rows.

In a further exemplary embodiment, integrated components with functions that are different from one another are arranged in a package body 324, 324a, and then the method processes explained on the basis of FIGS. 2A to 2J are carried out for these components.

It is also possible for a number of integrated components to be arranged next to one another for each device.

Figure 3:
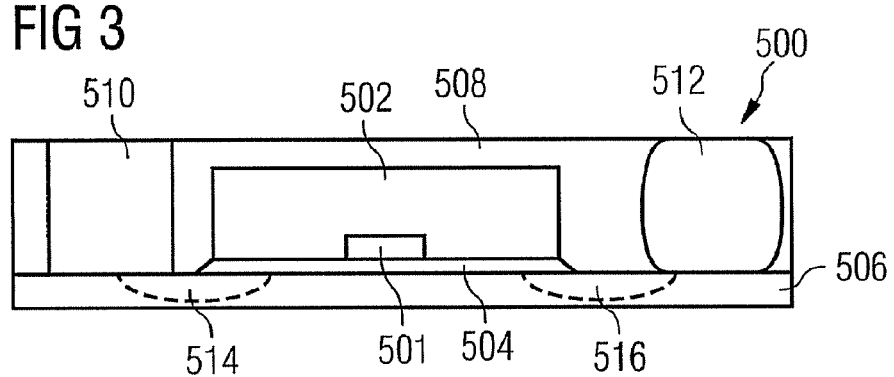
FIG. 3 illustrates a device according to a further embodiment.

FIG. 3 illustrates a device 500 according to a further exemplary embodiment. A transistor 501 is contained in an integrated component 502, and is intended to illustrate the active side of the integrated component 502. The device 500 also includes an optional contact arrangement 504 with respect to a wiring arrangement 506. The contact arrangement 504 includes, for example, soldered connections.

The wiring arrangement 506 is, for example,
a thin-film wiring arrangement,
a printed circuit board, for example plastic-based or ceramic-based,
another wiring arrangement, for example initially self-supporting, see, for example, bonding wires 514, 516 of, for example, Au, Al or Cu.

The device also includes a package body 508, for example epoxy-based. Arranged in the package body 508, to the side of the component 502, are contact devices, which penetrate the package body, for example:
contact cylinders 510, for example of copper, copper alloy, aluminum or an aluminum alloy.

The contact cylinders 510, the package body 508 includes contact bodies 512, which are likewise arranged to the side of the component 502 and penetrate the package body 508. The contact body 512 has, for example, a barrel form or an ellipsoid form. In one embodiment, the contact cylinder 510 or the contact body 513 may protrude somewhat from the package body 508 toward the wiring arrangement 506 or terminate with the package body 508. Otherwise, for example, the production processes explained above are carried out to produce the device 500.

If a self-supporting wiring device 506 is used, the bonding wires 514, 516, for example, are only attached after the package body 508 is produced.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a device, comprising:
   arranging contact devices on a carrier;
   arranging an integrated component on the carrier between the contact devices;
   introducing a material into an intermediate space between the contact devices and the integrated component to provide a package body such that the material directly contacts the contact devices;
   working the material back on one side, so that the contact devices are exposed on the worked-back side of the package body;
   applying solder paste projections on the exposed contact devices; and
   thermally treating the solder paste projections to provide solder regions having a diameter smaller than a diameter of the contact devices,
   wherein a thickness of the contact devices in a direction perpendicular to the carrier at least equals a thickness of the integrated component in the direction perpendicular to the carrier.

2. The method of claim 1, comprising arranging the contact devices on the carrier in the solid state.

3. The method of claim 1, comprising arranging solder balls as contact devices.

4. The method of claim 1, comprising introducing the material by a compression-molding process.

5. The method of claim 1, comprising producing a wiring arrangement by the thin-film technique on the component and on at least one contact device of the contact devices and with preference also on the package body.

6. The method of claim 5, comprising providing the contact devices with a solder material, on the side that is facing away from the wiring arrangement.

7. The method of claim 1, comprising connecting the device in an electrically conductive manner to a further device, the further device including an integrated component.

8. The method of claim 1, comprising carrying out the method out simultaneously in joint operations for a number of devices.

9. The use of a ball placing machine for carrying out a method of claim 1, comprising:
a machine which arranges more than 1000 contact devices simultaneously.

10. The method of claim 1, comprising introducing the material by printing, pouring, spraying, or spin-coating.

11. The method of claim 1, comprising stacking the device on a further device and connecting the device to the further device in an electrically conductive manner via the contact devices, the further device including an integrated component.

12. The method of claim 1, comprising removing the carrier from the contact devices, the integrated component, and the material.

13. The method of claim 12, wherein once the carrier is removed each contact device penetrates the package body from a first side of the package body to a second side of the package body facing away from the first side.

14. The method of claim 1, wherein arranging the contact devices comprises arranging contact devices comprising solder material.

15. The method of claim 1, wherein introducing the material comprises introducing a material comprising an epoxy material.

16. The method of claim 1, wherein introducing the material comprises introducing a material comprising a plastic.

17. A method for producing a device, comprising:
providing a carrier with an adhesive on the carrier;
arranging contact devices on the adhesive, the contact devices having a first thickness in a direction perpendicular to the carrier;
arranging an integrated component on the adhesive between the contact devices, the integrated component having a second thickness in the direction perpendicular to the carrier, the first thickness being at least equal to the second thickness;
introducing a material into an intermediate space between the contact devices and the integrated component to provide a package body such that the material directly contacts the contact devices, the integrated component, and the adhesive;
working the material back to expose the contact devices;
removing the carrier and the adhesive from the contact devices, the integrated component, and the material;
producing a wiring arrangement on the integrated component, the material, and on at least one of the contact devices;
applying a solder resist layer on the wiring arrangement;
applying solder paste projections on the exposed contact devices opposite the wiring arrangement; and
thermally treating the solder paste projections to provide solder regions having a diameter smaller than a diameter of the contact devices.

18. The method of claim 17, wherein producing the wiring arrangement comprises producing the wiring arrangement such that the wiring arrangement is arranged on an active side of the integrated component.

19. The method of claim 17, wherein arranging the contact devices on the adhesive comprises arranging solder balls on the adhesive, and
wherein introducing the material comprises introducing the material using a compression-molding process.

20. The method of claim 17, wherein working the material back comprises grinding the material.

21. A method for producing devices, comprising:
providing a carrier;
arranging contact devices on the carrier, the contact devices having a first thickness in a direction perpendicular to the carrier;
arranging at least two integrated components on the carrier between the contact devices, the integrated components having a second thickness in the direction perpendicular to the carrier, the first thickness being at least equal to the second thickness;
introducing a material into an intermediate space between the contact devices and the integrated components to provide a package body such that the material directly contacts the contact devices and the integrated components;
working the material back to expose the contact devices;
removing the carrier from the contact devices and the integrated components; and
separating the integrated components from each other to provide at least two devices, each device including an integrated component and at least one contact element.

22. The method of claim 21, wherein arranging the contact devices on the carrier comprises arranging solder balls on the carrier.

23. The method of claim 21, wherein working the material back comprises grinding the material.

24. The method of claim 21, wherein working the material back comprises working the material back to expose the integrated components.

25. The method of claim 21, wherein working the material back comprises working the material back to thin the integrated components.

26. The method of claim 21, further comprising:
applying solder paste projections on the exposed contact devices; and
thermally treating the solder paste projections to provide solder regions having a diameter smaller than a diameter of the contact devices.

27. The method of claim 21, further comprising:
producing a wiring arrangement on the integrated components, the material, and on at least one of the contact devices; and
applying a solder resist layer on the wiring arrangement.

28. The method of claim 21, further comprising:
producing a wiring arrangement on the integrated components, the material, and on at least one of the contact devices;
applying a solder resist layer on the wiring arrangement;
applying solder paste projections on the exposed contact devices opposite the wiring arrangement; and
thermally treating the solder paste projections to provide solder regions having a diameter smaller than a diameter of the contact devices.

* * * * *